(12) United States Patent
Kankani et al.

(10) Patent No.: US 9,164,830 B2
(45) Date of Patent: Oct. 20, 2015

(54) METHODS AND DEVICES TO INCREASE MEMORY DEVICE DATA RELIABILITY

(71) Applicant: Seagate Technology LLC, Cupertino, CA (US)

(72) Inventors: Navneeth Kankani, Eden Prairie, MN (US); Mark Allen Gaertner, Vadnais Heights, MN (US); Rodney Virgil Bowman, Bloomington, MN (US); Ryan James Goss, Prior Lake, MN (US); David Scott Seekins, Shakopee, MN (US); Tong Shirh Stone, Eden Prairie, MN (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/154,859

(22) Filed: Jan. 14, 2014

(65) Prior Publication Data

US 2014/0129891 A1 May 8, 2014

Related U.S. Application Data

(62) Division of application No. 13/019,832, filed on Feb. 2, 2011, now Pat. No. 8,631,294.

(51) Int. Cl.
*H03M 13/00* (2006.01)
*G06F 11/10* (2006.01)
*G11C 29/52* (2006.01)

(52) U.S. Cl.
CPC .......... *G06F 11/102* (2013.01); *G06F 11/1012* (2013.01); *G11C 29/52* (2013.01)

(58) Field of Classification Search
CPC .................................................. G06F 12/0871
USPC .................................................. 714/780, 758
See application file for complete search history.

(56) References Cited

U.S. PATENT DOCUMENTS

| | | | | |
|---|---|---|---|---|
| 5,347,648 | A * | 9/1994 | Stamm et al. | 714/5.11 |
| 8,040,744 | B2 * | 10/2011 | Gorobets et al. | 365/200 |
| 8,094,500 | B2 * | 1/2012 | Paley et al. | 365/185.12 |
| 8,244,960 | B2 * | 8/2012 | Paley et al. | 711/103 |
| 8,301,980 | B2 * | 10/2012 | Gruner et al. | 714/769 |
| 8,316,277 | B2 * | 11/2012 | Flynn et al. | 714/763 |
| 8,631,294 | B2 | 1/2014 | Kankani et al. | |
| 2006/0062049 | A1 | 3/2006 | Lee et al. | |
| 2010/0074024 | A1 | 3/2010 | Roohparvar | |
| 2010/0211833 | A1 | 8/2010 | Weingarten | |

OTHER PUBLICATIONS

File History for U.S. Appl. No. 13/019,832.

* cited by examiner

*Primary Examiner* — Esaw Abraham
(74) *Attorney, Agent, or Firm* — Hollingsworth Davis, LLC

(57) ABSTRACT

A first data set is written to first memory units identified as having a higher data reliability and a second data set is written to second memory units identified as having a lower data reliability than the first memory units. In some cases, the second data set may include metadata or redundancy information that is useful to aid in reading and/or decoding the first data set. The act of writing the second data set increases the data reliability of the first data set. The second data set may be a null pattern, such as all erased bits.

12 Claims, 8 Drawing Sheets

METHODS AND DEVICES TO INCREASE
MEMORY DEVICE DATA RELIABILITY

RELATED APPLICATIONS

This application is a divisional of U.S. patent application Ser. No. 13/019,832, filed on Feb. 2, 2011, and which is hereby incorporated herein by reference in its entirety.

SUMMARY

Various embodiments are generally directed to increasing the data reliability of memory devices. Some embodiments involve methods of operating a memory device to increase data reliability. A first data set is written to first memory units and a second data set is written to second memory units. The second memory units are associated with lower data reliability than the first memory units. The act of writing the second data set increases the data reliability of the first data set. The second data set includes one or both of information that is useable to increase the reliability of the first data set and a dummy pattern.

The lower data reliability of the second data units may be due to non-random failures that arise from hardware configuration of the memory device or from algorithmic operation of the memory device, or both.

In some cases, the second data set may include metadata that is useful to aid in reading or decoding the first data set. To take into account the lower reliability of the second data units, redundant copies of the metadata may be stored. In some cases, the second data set may contain redundancy information configured to protect the data stored in the first memory units. For example, the redundancy information may be associated with multiple types of error correcting coding (ECC). If multiple types of ECC are used, the memory controller may implement a voting scheme to identify the correctly decoded data. For example, the controller may decode the first data set using each type of ECC. The correctly decoded data is identified as the decoded data that is produced as the result of decoding using a majority of the ECCs.

Some embodiments involve a method of operating a solid state memory device. First memory pages having a higher data reliability and second memory pages having a lower data reliability are identified. A first data set is written to the first pages and a second data set is written to the second pages. The second data set includes at least one of information that increases the data reliability of the first data set and a dummy pattern. In some cases, the second memory units include a predetermined number of memory pages of a memory block that are written last during a write operation of the memory block. For example, the predetermined number may be four.

In some cases, the dummy pattern may comprise all erased bits.

In some cases writing the second data set may comprises writing a test pattern. The test pattern may be read and the results of reading the test pattern used to determine parameters to read the first memory units.

Some embodiments involve a memory device that includes memory storage and a memory controller. The memory storage includes first memory units identified as having higher data reliability and second memory units identified as having lower data reliability. The memory controller is configured to write a first data set to the first memory units identified as having higher data reliability and to write a second data set to the second memory units identified as having lower data reliability, wherein the second data set increases reliability of the first data set. For example, the act of writing the second data set to the second memory units may increase data reliability of the first data set without regard to information written to the second data set.

In some cases, the memory controller may be configured to identify the second memory units as having lower reliability. For example, the memory controller may make this identification based on the bit error rate of the second memory units.

In some cases, the second memory units have lower data reliability due to non-random errors arising from one or both of hardware configuration of the memory device and algorithmic operation of the memory device.

According to some aspects, the memory storage comprises flash memory. The second memory units may include a predetermined number of memory pages of a memory block that are written last during a write operation of the memory block.

These and other features and aspects of the various embodiments disclosed herein can be understood in view of the following detailed discussion and the accompanying drawings.

DETAILED DESCRIPTION

Memory devices are generally organized into a number of memory units that are used to store data. According to one implementation, each memory unit corresponds to a page of solid state memory cells. Alternatively, the memory units may correspond to data tracks on magnetic media, or memory units of other storage media. Each memory unit of a memory device can be associated with a characteristic data reliability which indicates the ability of the memory unit to store and retain data without errors over a period of time. Different memory units of a memory device may be associated with different data reliabilities, e.g., first memory units of a memory device may be associated with a higher data reliability than second memory units of the same memory device. Thus, for a given period of time, the first memory units associated with the higher data reliability can store and retain data with fewer errors than the second memory units associated with the lower data reliability. As discussed below, the differences in data reliability between memory units of a memory device can arise due to random errors or due to systematic errors caused by the hardware configuration of the memory units. In some implementations, the systematic errors can arise from the process used to write data to and/or read data from the memory units. Devices and methods disclosed herein involve writing data sets to the memory units of a memory device based on the reliability of the memory units.

Figure 1:
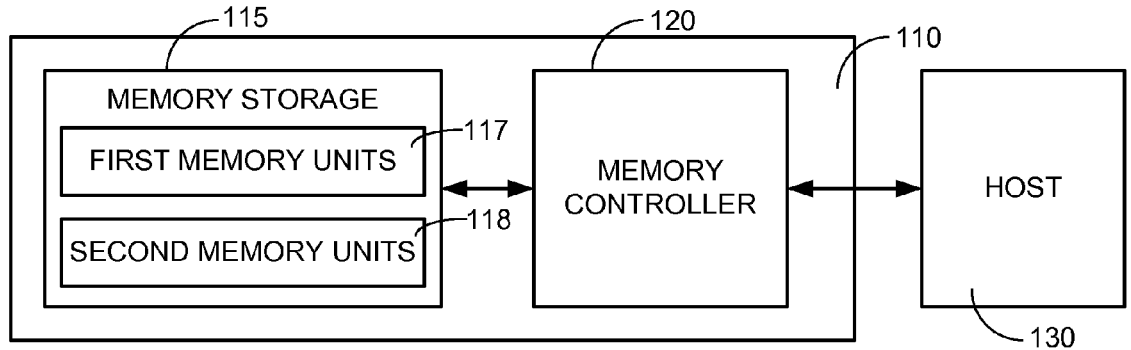
FIG. 1 is a block diagram illustrating a memory system configured to increase data reliability in accordance with disclosed embodiments.

FIG. 1 is a block diagram of a memory device 110 comprising memory storage 115 and a memory controller 120. The memory storage includes a number of memory units, e.g., pages or tracks, including first memory units 117 associated with a first data reliability and second memory units 118 associated with a second data reliability which is lower than the first data reliability.

The memory controller is configured to take into account the different data reliabilities associated with different data units when writing data to the memory units. For example, the memory controller may be configured to write data only to the higher reliability memory units (first memory units) and may ignore the memory units (second memory units) having a lower reliability. In some implementations, the memory controller may be configured to write data requiring relatively high data reliability to the first memory units and to write data that does not require high data reliability to the second memory units. The data written to the first memory units may contain more critical information, e.g., program code, in comparison to the data written to the second memory units, which may be more tolerant of errors. In some cases, the memory controller may write information to the second memory units that is useful to interpret, e.g., read and/or decode the data stored in the first memory units.

In some cases, the act of writing the second memory units increases the data reliability of the first memory units. The bits stored in the second memory units may or may not be useable to interpret the data stored in the first memory units. For example, the controller may write a dummy pattern (all erased bits, random, or other pattern) to the second memory units. The writing of the dummy pattern can improve the data reliability of the first memory units, as described below.

Although only first and second memory units are shown in FIG. 1, it will be appreciated that the memory device may be organized into any number of groups of memory units, each group associated with a different reliability. The controller may be configured to write data sets to the multiple groups of memory units taking into account the different reliabilities of the groups of memory units. In some implementations, the controller may be configured to determine which memory units are higher reliability memory units and which memory units are lower reliability units. The controller may perform this function, for example, by tracking the bit error rate (BER) of the memory units.

Figure 2A:
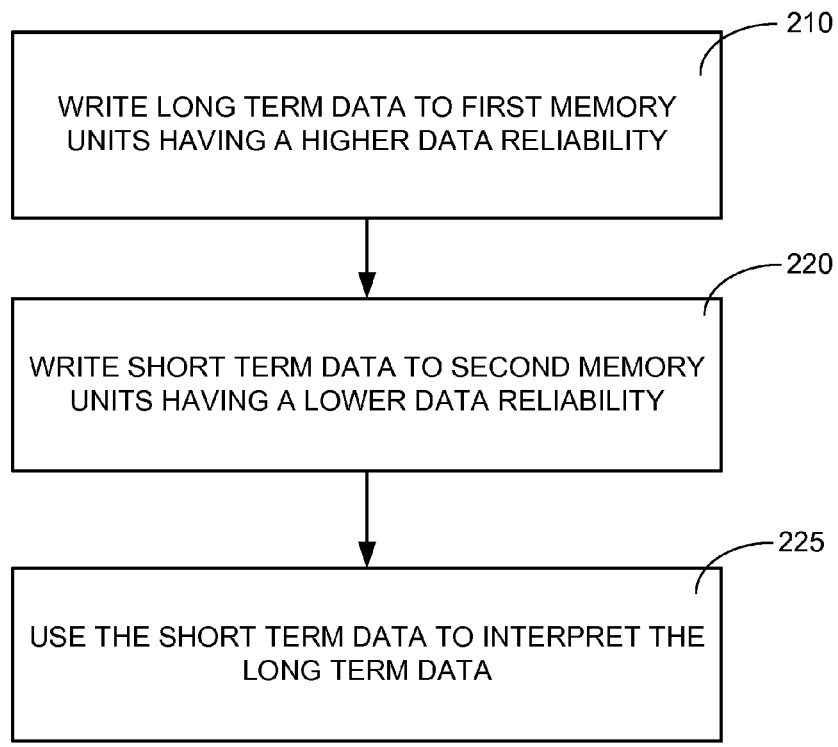
FIG. 2A is flow diagram illustrating a process of supplementing the reliability of a long term data set written to first memory units having a higher reliability using short term data written to second memory units that have a lower reliability.

In some cases, as illustrated by the flow diagram of FIG. 2A, data written 210 to the first memory units may need to be retained for a longer period of time than data written 220 to the second memory units. The short term data is used 225 to interpret the long term data.

Figure 2B:
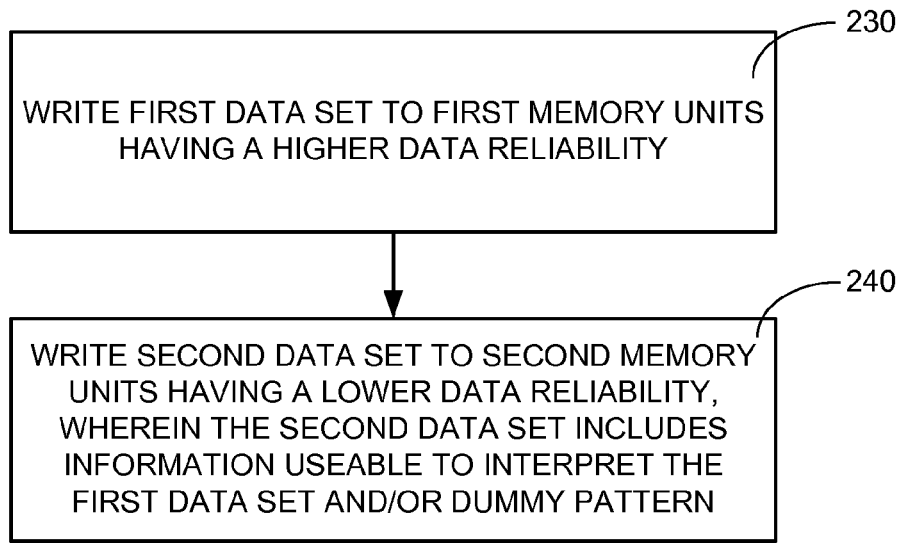
FIG. 2B is a flow diagram illustrating a process of supplementing the reliability of a first data set written to first memory units having a higher reliability by writing a second data set to second memory units having a lower reliability.

In some cases, as illustrated by the flow diagram of FIG. 2B, a first data set is written 230 to first memory units having a higher data reliability and a second data set is written 240 to second memory units having a lower data reliability. The second data set stored in the second memory units may include information useable to interpret the first data set and/or may include a dummy pattern.

In some configurations, the act of writing data into the second data units improves the reliability of the data written to the first data unit. In these configurations, the second data set may not include information that is used by the controller. At least some of the bits of the second data set may be a dummy pattern, such as all erased bits or a random pattern.

Figure 3:
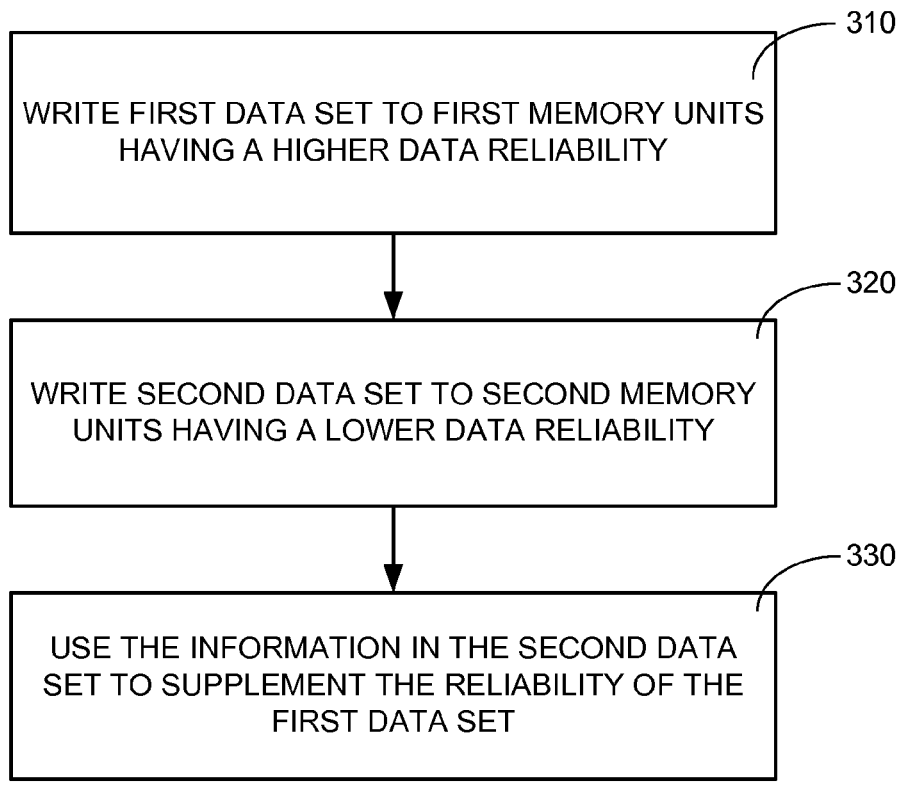
FIG. 3 is a flow diagram illustrating a process of supplementing the reliability of a first data set written to first memory units having a higher reliability by using the information of a second data set stored in second memory units having a lower reliability.

In some configurations, as illustrated by the flow diagram of FIG. 3, the first data set is written 310 to first memory units and the second data set is written 320 to the second memory units. The information in the second data set is read from the second memory units and is operated on 330 by the controller to increase the reliability of the data stored in the first data units. For example, the information in the second data set may include redundancy information for the first data set, and/or various type of metadata associated with the first memory units, such as a defect map, a reference voltage map, a bit error rate map, and/or any other information that supplements the reliability associated with writing, reading and/or decoding the first data set stored in the first memory units. Information stored in the second memory units may be used during a write operation that writes the first data set to the first memory units, e.g., to avoid memory cells in the first memory units that have a high BER, and/or may be used during a read operation that reads data from the first memory units, e.g., a reference voltage map may provide the reference voltages used to read certain ones of the first memory units and/or may be used when data read from the first memory units is decoded, e.g., redundancy information used to correct errors in the first data set.

In some embodiments, the memory controller may be configured to identify the pages having higher reliability and the pages having lower reliability, for example, based on the bit error rate (BER) of the pages. In other embodiments, the lower reliability pages may be known a priori. For example, the lower reliability pages may be identifiable based on the hardware configuration of the memory units and/or the algorithmic configuration used to access the memory units.

In some cases, the first and second memory units may be pages of a non-volatile solid state memory device (SSD), such as flash memory. The hardware architecture of the SSD, design page mapping, and/or algorithm used write data to the pages, may cause some pages of the SSD to be less reliable (e.g., have a higher BER) than other pages of the SSD. The pages of SSD such as flash memory are erased and written in blocks, where there are a number of pages per block, e.g., 64 pages per block, 128 pages per block, 256 pages per block. Some groups of pages in each block may be associated with lower data reliability and other pages in each block may be associated with a higher data reliability. The lower reliability pages may comprise one or more of last written pages, higher address pages, and/or pages associated with higher significant bits, for example.

Some SSDs are capable of storing multiple bits per memory cell. For example, in SSDs that include memory cells capable of storing two bits of information, each memory cell stores a most significant bit (MSB) and a least significant bit (LSB). Each physical page of the memory device may be arranged in MSB and LSB pages. Due to the hardware and/or software configuration of the SSD, the MSB and LSB pages can have significantly different bit error rates.

Figure 4:
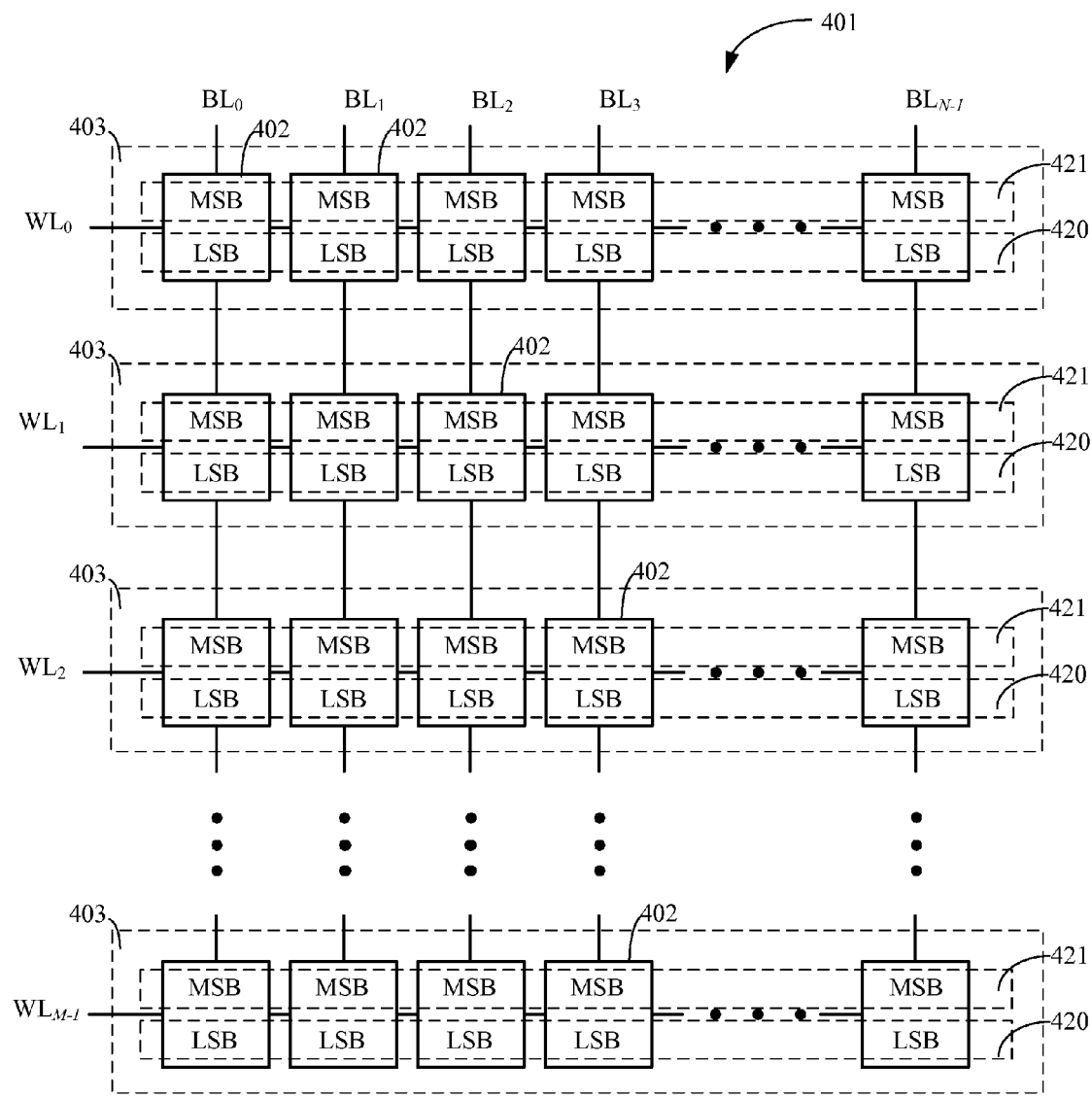
FIG. 4 is a depiction of a portion of a solid state memory device that includes multiple memory units comprising multi-level memory cells.

FIG. 4 illustrates a block 401 of memory cells 402 that are capable of storing two bits of information denoted the most significant bit (MSB) and the least significant bit (LSB). Although this example involves multi-level memory cells that store two bits per memory cell, in general, multi-level memory cells may store three, four bits, five bits or even more bits per memory cell.

Each physical page 403 associated with a word line can be subdivided into multiple logical pages 420, 421, as illustrated in FIG. 4. One logical page 420, 421 for each type of bit may be stored in the memory cells 402 of the physical page 403. Memory cell arrays that subdivide one physical page into multiple logical pages corresponding to the number of bits stored in multi-level memory cell are referred to herein as having multi-page architecture. In the exemplary memory storage array block 301 illustrated in FIG. 4 each physical page 403 associated with a word line $WL_1$-$WL_{M-1}$ is subdivided into two logical pages 420, 421. A first logical page 420 includes the LSBs of the memory cells 402 of the physical page 403. The second logical page 421 includes the MSBs of the memory cells 402 of the physical page 403. The logical pages 420, 421 associated with a physical page 403 are capable of being accessed (programmed or read) independently of each other. The LSBs stored in the memory cells of the physical page are accessed using a first logical page address and the MSBs stored in the memory cells of the physical page are accessed using a second logical page address.

Figure 5:
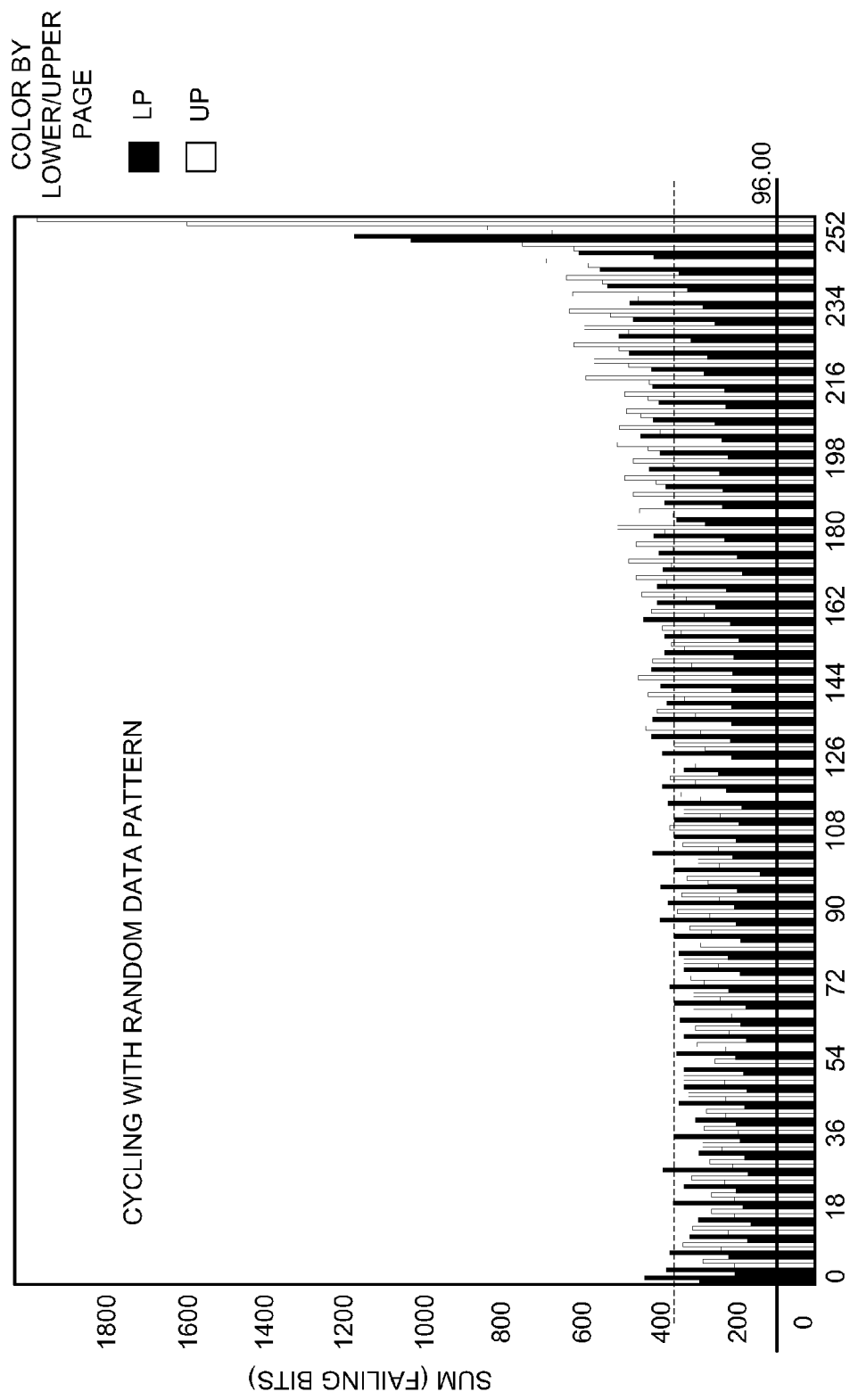
FIG. 5 shows bit error rate (BER) data for a block of memory pages of a solid state memory device showing the relationship between BER and write time for a random data pattern.

In some cases, the bit error rate of SSD pages of a block (or other grouping of pages) may increase with time of the write operation and/or page address. FIG. 5 illustrates a graph of bit error rate vs. page address for a block of an SSD having multi-level memory cells after stress testing that simulates 15,000 erase/write cycles and a retention time of 6 months. A block write cycle of the SSD includes writing the entire block, in this case 256 pages, of which 128 are LSB pages and 128 are MSB pages. In this example, in general, the MSB pages have a higher BER than the LSB pages. Furthermore, pages written last during the block write cycle have a higher BER than pages written earlier in the write cycle. Pages having page addresses 250, 251, 254, 255 are the four pages written last during a block write. As illustrated by FIG. 5, the last written pages (such as page addresses 250, 251, 254, 255) have almost 3 times the BER of previously written pages in the block.

In some implementations discussed herein, a predetermined number of the last written pages (e.g., page addresses 250, 251, 254, 255) may correspond to the lower reliability second memory units and the previously written pages (e.g., page addresses 1-249, 252, and 253) correspond to the higher reliability first memory units. The last written pages exhibit higher BER because they do not benefit from the program disturb effects and floating gate to floating gate coupling effects experienced by the previously written pages. These effects arise due to hardware configuration of the SSD and/or the algorithmic configuration of the write cycle.

Figure 6:
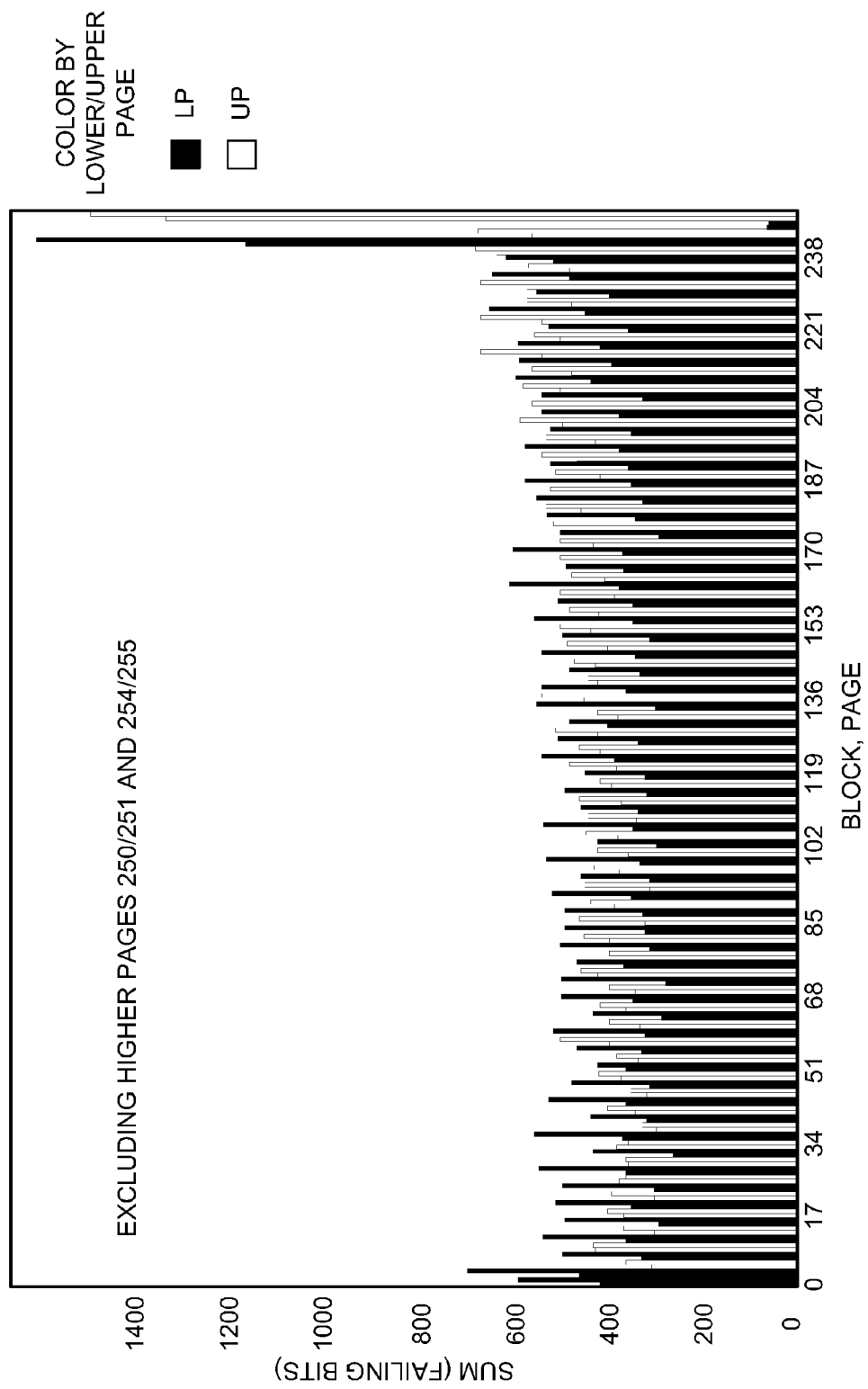
FIG. 6 shows BER data vs. write time for a block of memory pages when the last written pages are ignored.
Figure 7:
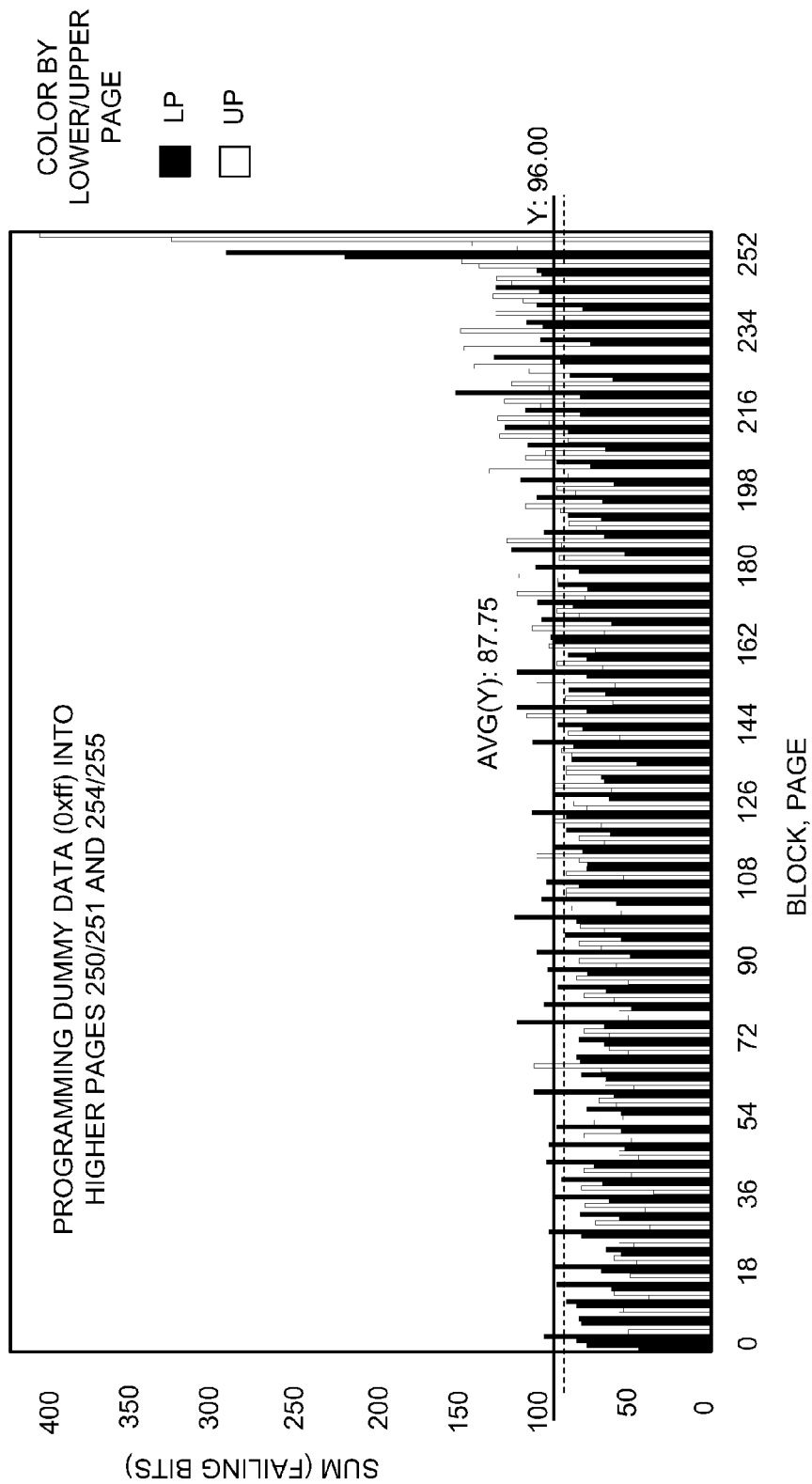
FIG. 7 shows BER data vs. write time for a block of memory pages when dummy data is written to the last written pages.

If the four last written pages, page addresses 250, 251, 254, 255, are ignored during block write operations, page addresses 246, 247, 252, 253 become the four last written pages and the higher BER shifts to these pages, as illustrated in FIG. 6. This occurs because if page addresses 250, 251, 254, 255 are not written to, page addresses 246, 247, 252, 253 do not experience the program disturb effects and floating gate to floating gate coupling effects that would have occurred if pages 250, 251, 254, 255 were written. Thus, in some cases, ignoring the low reliability pages for the purpose of writing data merely shifts the problem to the other pages in the block that then become the last written pages. As previously discussed in connection with flow diagrams 2A, 2B, and 3, writing a second data set to the lower reliability pages may be implemented to supplement the reliability of the higher reliability pages, even if the second data set does not include any meaningful information. In various implementations, a dummy pattern, e.g., a random pattern, or all 0's or all 1's, may be written into the second memory units and the act of writing this data to the second memory units supplements the reliability of the first memory units. FIG. 7 illustrates the improvement in the BER of the next to last written page addresses 246, 247, 252, 253 when the last written page addresses 250, 251, 254, 255 are programmed to the erased state (all 1's). Programming the second memory units to the erased state is faster than programming other non-random patterns or a random pattern. Thus, the data set written to the second data units may include all erased bits or may predominantly include erased bits, e.g., over 50% of the bits of the second data set may be erased bits.

In some cases, the data set written to the second memory units includes information that can be used to supplement the reliability of the data written to the first memory units. The useable information may be stored in some of the second memory units and a dummy pattern may be stored in some of the second memory units. For example, the useable information may include a known data pattern written to the second memory units. The known data pattern can be used to predict the failure characteristics for the first memory units. If the failure characteristics of the first memory units are predicted, the controller can take some action to compensate and avoid data errors. For example, the controller may use the information in the second memory units to determine that the reference voltages used to read the first memory units need to be adjusted and/or may adjust the reference voltages used to read the first memory units, thereby avoiding errors.

Figure 8:
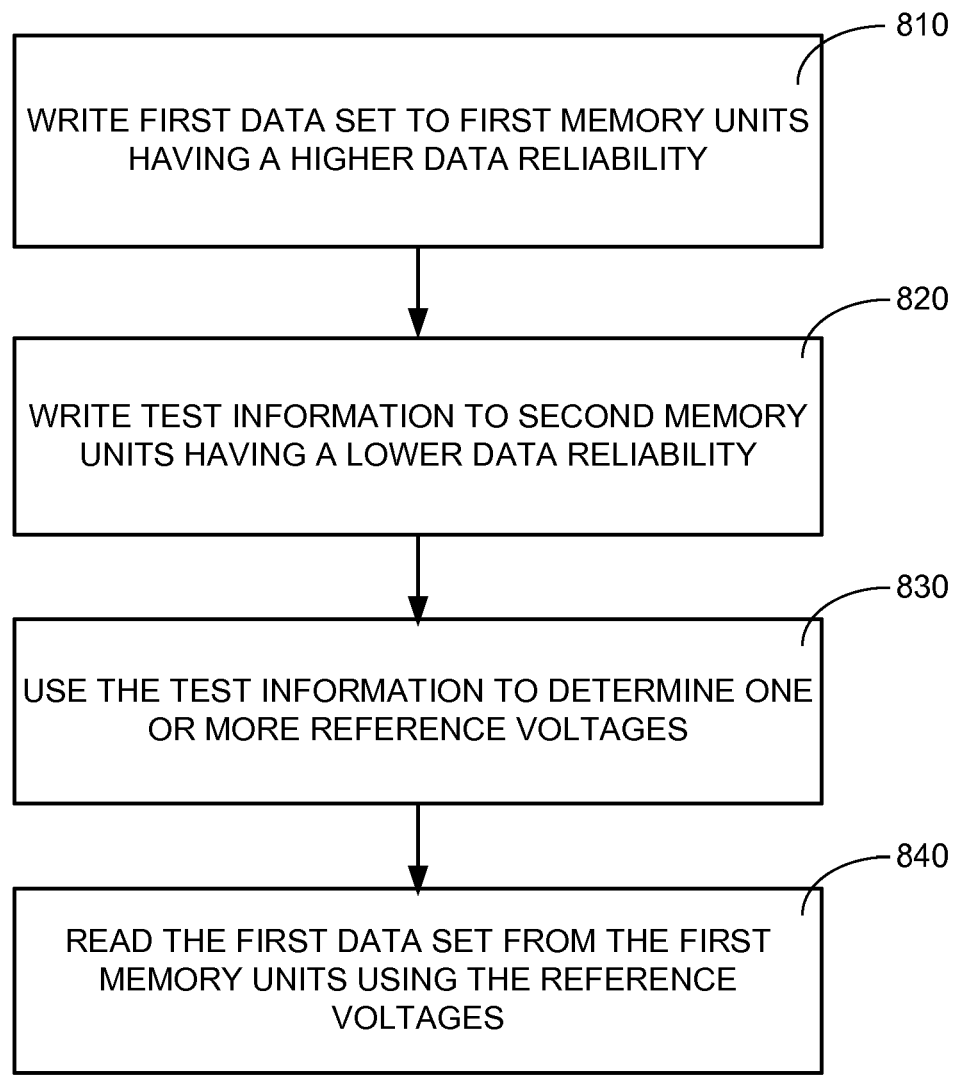
FIG. 8 is a flow diagram illustrating a process that involves writing test information to the low reliability memory units.

The flow diagram of FIG. 8 illustrates a process of using the information of the second data set stored in the second memory units to supplement the reliability of the first data set stored in the first memory units. According to this process, the first data set is written 810 to the first memory units and the second data set includes test information comprising a known data pattern which is written 820 to the second memory units. Before the first memory units are read, the test information is read from the second memory units. The test information is used 830 in conjunction with a correlation function, which may be developed during the initial characterization of the memory cells, to predict one or more reference voltages that will reduce the error rate of the first memory units. The first memory units are read 840 using the reference voltages predicted by the correlation function and the test information.

In some cases, the second memory units can be used to store metadata that is volatile across long retention times, but may be useful for short retention times. For example, the metadata can include one or more of information about defects in the first memory units, defect maps for the first memory units, reference voltage maps for the first memory units, and/or any other information that could be used to supplement the performance and/or endurance of the first memory units. To compensate for the higher error rate of the second memory units, multiple redundant copies of the metadata may be stored.

In some implementations, the second memory units can be used to store additional redundancy code that protects the data stored in the first memory units. The additional redundancy information could be an error correction code (ECC) that protects a portion or all of first data set stored in the first memory units, e.g., a portion or all of the memory block. The correction power of the additional redundancy code may be based on the amount of redundancy necessary to ensure the redundancy information is protected with the higher BER of the second memory units. For minimal retention times, the BER for the lower reliability second data units should be sufficiently small so that excess error correction coding is not required.

Figure 9:
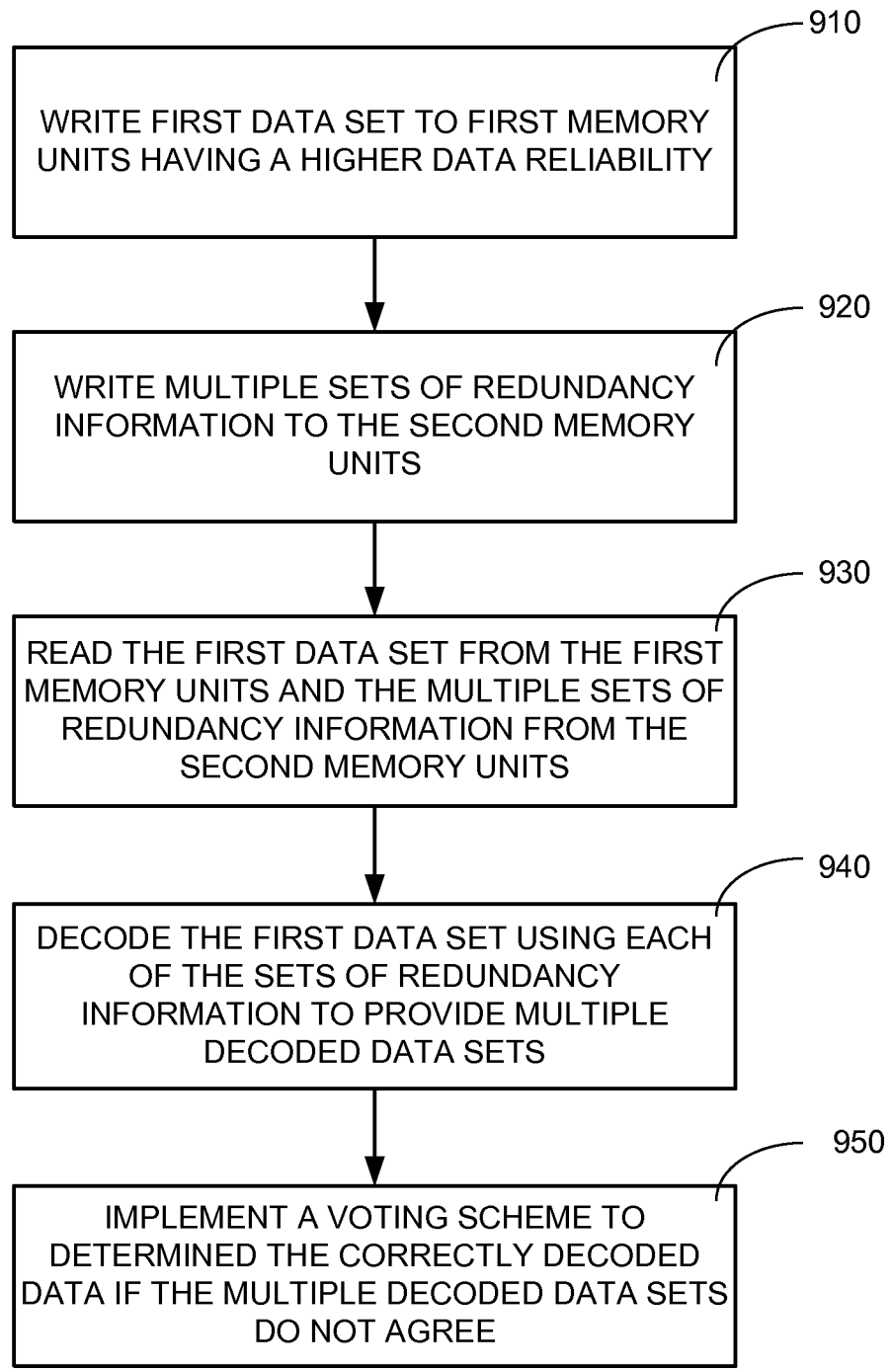
FIG. 9 is a flow diagram illustrating a process that involves writing multiple sets of redundancy information to the low reliability memory units.

In some cases, multiple sets of additional redundancy information stored in the second memory units may be used to protect data stored in the first memory units. When multiple redundancy information is employed, a voting scheme can be implemented to determine the correctly decoded data. FIG. 9 is a flow diagram that illustrates the use of multiple sets of redundancy information. A first data set is written 910 to the first memory units and multiple sets of redundancy information associated with the first data set are written 920 to the second memory units. Each of the multiple sets of redundancy information can employ different types of error correction coding, e.g., different ECCs having different error correction strengths.

When the first data set is accessed, the first data set and the multiple sets of redundancy information are read 930 from the first memory units and the second memory units, respectively. The first data set is decoded 940 using each set of redundancy information, producing multiple decoded data sets. If the decoded data sets do not agree, a voting scheme is implemented 950 to determine the correctly decoded data. For example, the voting scheme may involve determining if a majority of the sets of redundancy information produce the same set of decoded data. If so, the then the set of decoded data produced by the majority is determined to be the correctly decoded data.

The implementations described herein, such as those illustrated by flow diagrams of FIGS. 2, 3, 8, and 9, are not mutually exclusive and may be used together. For example, the second memory units may optionally store one or more of short retention information, map information, a test pattern, redundancy information, a dummy pattern and/or other information. One or more of the short retention information, map information, test pattern, redundancy information, and/or other types of information may be used to supplement the reliability of the first memory units.

It is to be understood that this detailed description is illustrative only, and various additions and/or modifications may be made to these embodiments, especially in matters of structure and arrangements of parts. Accordingly, the scope of the present disclosure should not be limited by the particular embodiments described above, but should be defined by the claims set forth below and equivalents thereof.

What is claimed is:

1. A method of operating a memory device, comprising:
    writing a first data set to first memory units;
    writing a second data set to second memory units, wherein the second memory units are associated with lower data reliability than the first memory units and the second data set includes one or more of: 1) information used to interpret the first data set and 2) a dummy pattern.

2. The method of claim 1, wherein the second data units have lower data reliability due to non-random errors arising from one or both of hardware configuration of the memory device and algorithmic operation of the memory device.

3. The method of claim 1, further comprising using the information contained in the second data set to increase the reliability of the first data set.

4. The method of claim 1, where the second memory units comprise a predetermined number of memory pages of a memory block that are written last during a write operation of the memory block.

5. The method of claim 1, wherein the dummy pattern comprises all erased bits.

6. The method of claim 1, wherein the second data set comprises one or both of multiple redundant copies of metadata used to aid in reading or decoding the first data set and redundancy information configured to protect the data stored in the first memory units.

7. The method of claim 6, wherein the redundancy information comprises redundancy information associated with multiple types of error correcting code, the method further comprising:
    decoding the data stored in the first memory units using the redundancy information of each of the multiple types of error correcting code to provide multiple sets of decoded data; and
    implementing a voting scheme among the multiple sets of decoded data to identify correctly decoded data.

8. The method of claim 1, wherein the second data set comprises a test pattern, the method further comprising reading the test pattern and using results of reading the test pattern to determine parameters to read the first memory units.

9. A memory device comprising a memory controller capable of being coupled to the first and second memory units, the memory controller configured to perform the method of claim 1.

10. A memory device comprising:
    a memory controller capable of being coupled to first and second memory units pages, the second pages having lower data reliability than the first pages, the memory controller configured to perform:
    writing a first data set to first memory units; and
    writing a second data set to second memory units, wherein the second data set includes one or more of: 1) information used to interpret the first data set and 2) a dummy pattern.

11. The memory device of claim 10, wherein the second data units have lower data reliability due to non-random errors arising from one or both of hardware configuration of the memory device and algorithmic operation of the memory device.

12. The memory device of claim 10, wherein the memory controller is further configured to use the information contained in the second data set to increase the reliability of the first data set.

* * * * *